(12) United States Patent
Sukegawa et al.

(10) Patent No.: US 8,872,291 B2
(45) Date of Patent: Oct. 28, 2014

(54) FERROMAGNETIC TUNNEL JUNCTION STRUCTURE AND MAGNETORESISTIVE EFFECT DEVICE AND SPINTRONICS DEVICE UTILIZING SAME

(71) Applicant: National Institute for Materials Science, Ibaraki-ken (JP)

(72) Inventors: Hiroaki Sukegawa, Ibaraki-ken (JP); Seiji Mitani, Ibaraki-ken (JP); Tomohiko Niizeki, Ibaraki-ken (JP); Tadakatsu Ohkubo, Ibaraki-ken (JP); Kouichiro Inomata, Ibaraki-ken (JP); Kazuhiro Hono, Ibaraki-ken (JP); Masafumi Shirai, Miyagi-ken (JP); Yoshio Miura, Miyagi-ken (JP); Kazutaka Abe, Miyagi-ken (JP); Shingo Muramoto, Miyagi-ken (JP)

(73) Assignee: National Institute For Materials Science, Ibaraki-Ken (JP)

(*) Notice: Subject to any disclaimer, the term of this patent is extended or adjusted under 35 U.S.C. 154(b) by 219 days.

(21) Appl. No.: 13/627,664

(22) Filed: Sep. 26, 2012

(65) Prior Publication Data

US 2013/0221461 A1  Aug. 29, 2013

(30) Foreign Application Priority Data

Feb. 27, 2012  (JP) .................. 2012-039582

(51) Int. Cl.
  *H01L 29/82* (2006.01)
  *H01L 43/10* (2006.01)
  *H01L 27/22* (2006.01)

(52) U.S. Cl.
  CPC ............... *H01L 43/10* (2013.01); *H01L 27/228* (2013.01)

USPC ............... 257/421; 257/295; 257/E29.042; 438/3; 438/48

(58) Field of Classification Search
  CPC ....... H01L 43/10; H01L 43/08; H01L 27/228; H01L 43/12; H01F 10/3254; H01F 41/307; G01R 33/098; G11B 5/3909
  USPC ............ 257/421, 314, 295, E29.42, E29.17; 438/3, 48; 365/158
  See application file for complete search history.

(56) References Cited

U.S. PATENT DOCUMENTS

| | | | |
|---|---|---|---|
| 6,574,079 B2* | 6/2003 | Sun et al. | 360/324.2 |
| 2009/0097168 A1 | 4/2009 | Inomata et al. | |
| 2012/0091548 A1 | 4/2012 | Sukegawa et al. | |

FOREIGN PATENT DOCUMENTS

WO  WO2007126071  11/2007

OTHER PUBLICATIONS

S. Moodera et al., Large Magnetoresistance at Room Temperature in Ferromagnetic Thin Film Tunnel Junctions, Physical Review Letters, vol. 74, No. 16, p. 3273 to 3276, 1995.

(Continued)

*Primary Examiner* — Thinh T Nguyen
(74) *Attorney, Agent, or Firm* — Hoffmann & Baron, LLP (57) ABSTRACT

A ferromagnetic tunnel junction structure comprising a first ferromagnetic layer, a second ferromagnetic layer, and a tunnel barrier layer that is interposed between the first ferromagnetic layer and the second ferromagnetic layer, wherein the tunnel barrier layer includes a crystalline non-magnetic material having constituent elements that are similar to those of an crystalline oxide that has spinel structure as a stable phase structure; the non-magnetic material has a cubic structure having a symmetry of space group Fm-3m or F-43m in which atomic arrangement in the spinel structure is disordered; and an effective lattice constant of the cubic structure is substantially half of the lattice constant of the oxide of the spinel structure.

6 Claims, 5 Drawing Sheets

(56) References Cited

OTHER PUBLICATIONS

W. H. Butler et al., Spin-dependent tunneling conductance of Fe/MgO/Fe sandwiches, Physical Review B, vol. 63, p. 054416-1 to 054416-12, 2001.

X.-G. Zhang and W. H. Butler, Large magnetoresistance in bcc Co/MgO/Co and FeCo/MgO/FeCo tunnel junctions, Physical Review B 70, p. 172407-1 to 172407-4, 2004.

R. Shan et al., Demonstration of Half-Metallicity in Fermi-Level-Tuned Heusler Alloy Co2FeAl0.5Si0.5 at Room Temperature, Physical Review Letters, 102, p. 246601-1 to 246601-4, 2009.

Y. Miura et al., Coherent tunnelling conductance in magnetic tunnel junctions of half-metallic full Heusler alloys with MgO barriers, Journal of Physics; Condensed Matter, 19, 365228(p. 1-7), 2007.

H. Sukegawa et al., Spin-polarized tunneling spectroscopy of fully epitaxial magnetic tunnel junctions using Co2FeAl0.5Si0.5 Heusler alloy electrodes, Physical Review B 79, p. 184418-1 to 184418-6, 2009.

H. Sukegawa et al., Tunnel magnetoresistance with improved bias voltage dependence in lattice-matched Fe/spinel MgAl2O4/Fe(001) junctions, Applied Physics Letters, 96, p. 212505-1 to 212505-3, 2010.

K. E. Sickafus, Comment on Order-disorder phase transition induced by swift ions in MgAl2O4 and ZnAl2O4 spinels by D. Simeone et al., 1. Nucl. Mater. 300 (2002) 151-160, Journal of Nuclear Materials, 312, p. 111 to 123, 2003.

S. Yuasa et al., Giant room-temperature magnetoresistance in single-crystal Fe/MgO/Fe magnetic tunnel junctions, Nature Materials, vol. 3, p. 868 to 871, 2004.

H. X. Wei et al., 80% tunneling magnetoresistance at room temperature for thin Al—O barrier magnetic tunnel junction with CoFeB as free and reference layers, Journal of Applied Physics, 101, p. 09B501-1 to 09B501-3, 2007.

H. Sukegawa et al, Improvement of tunnel magnetoresistance and reduction of tunnel resistance in epitaxial CoFe/MgAl2O4/CoFe(001) tunnel junctions, Digests of the 35th Annual Conference on Magnetics in Japan 2011, p. 137, The Magnetic Society of Japan, Sep. 27, 2011.

\* cited by examiner

FERROMAGNETIC TUNNEL JUNCTION STRUCTURE AND MAGNETORESISTIVE EFFECT DEVICE AND SPINTRONICS DEVICE UTILIZING SAME

BACKGROUND OF THE INVENTION

1. Field of the Invention

The present invention relates to a ferromagnetic tunnel junction structure constituted of a tunnel barrier layer and two ferromagnetic layers that sandwiches the tunnel barrier layer, and application of the same structure to a magnetoresistive effect device and to spintronics devices. Priority is claimed on Japanese Patent Application No. 2012-039582 filed on Feb. 27, 2012, the content of which is incorporated herein by reference.

2. Description of Related Art

In recent years, giant magnetoresistance (GMR) effect device constituted of multilayers of ferromagnetic layer/non-magnetic metal layer, and ferromagnetic tunnel junction (MTJ) device constituted of ferromagnetic layer/insulation layer (tunnel barrier layer, barrier layer)/ferromagnetic layer have been paid much attentions to as novel devices for magnetic field censors and nonvolatile random access magnetic memories (MRAM). Known types of GMR includes current-in-plane type GMR(CIP-GMR) in which the electric current flows in the film plane, and current-perpendicular-to-plane type GMR(CPP-GMR) in which the electric current flows in a direction perpendicular to the film plane. The principle of GMR mainly depends on spin-dependent scattering in the interface between the magnetic layer and the nonmagnetic layer, and includes contribution from spin-dependent scattering (bulk-scattering) in the magnetic body.

Since the contribution of bulk-scattering is expected in the CPP-GMR, CPP-GMR is generally constituted larger than the CIP-GMR. A spin-valve type device is used as the GMR device, where spins in a ferromagnetic layer are fixed by an antiferromagnetic layer that is close to the ferromagnetic layer.

On the other hand, so-called tunnel magnetoresistance (TMR) effect is obtained in the MTJ device, where intensity of tunnel current in the direction perpendicular to the layer plane are made different in the two ferromagnetic layers by controlling magnetization of the two ferromagnetic layers in parallel or in anti-parallel.

The TMR value in the tunnel junction depends on spin polarization P in the interface between the ferromagnetic body and insulator, and is generally given by the below described formula 1, where $P_1$ and $P_2$ denote spin polarizations of two ferromagnetic bodies.

$$TMR = 2P_1P_2/(1-P_1P_2) \quad \text{formula 1}$$

Here, the spin polarization of a ferromagnetic body satisfies $0 < P \leq 1$. Conventionally, Al oxide (AlOx) film of amorphous structure and MgO film with (001) plane orientation have been used as the barrier. In the former case, the film is formed by oxidation (for example, by plasma oxidation) of Al metal film formed, for example, by sputtering. It is widely known that such a film has an amorphous structure (for example, J. S. Moodera et al., Phys. Rev. Lett. 74, 3273 (1995)). On the other hand, it is known that the MgO barrier can be prepared by direct sputtering MgO from MgO target, or by vapor deposition of MgO by evaporating MgO shot (piece) utilizing electron beam.

As it is shown by the formula 1, infinitely large TMR value is expected where a ferromagnetic body of spin polarization of P=1 is used. The magnetic body of P=1 is called a half-metal. As a result of band calculation, oxides such as $Fe_3O_4$, $CrO_2$, $(La-Sr)MnO_3$, $Th_2MnO_7$, and $Sr_2FeMoO_6$, half-Heusler alloys such as NiMnSb, Full-Heusler alloys such as $Co_2MnGe$, $Co_2MnSi$, and $Co_2CrAl$, each having an $L2_1$ structure are known the half-metals.

Currently, the MTJ device is practically applied as magnetic heads of hard disk and non-volatile random access magnetic memories (MRAMs). In a MRAM, MTJ devices are arranged in 2-dimensional matrix, and a magnetic field is applied by generating electric currents in independently disposed wirings. By this constitution, a high resistive state and a low resistive state are created by controlling magnetization of two magnetic layers of each MTJ element in parallel or in antiparallel, and thereby recording "one" and "zero" signals. Reading of the record is performed utilizing the TMR effect. In such a field of application, an MTJ device of low resistance is required for high-speed operation. In addition, an MTJ device of low resistance is required due to the increasing importance of spin transfer magnetization switching, where magnetization of the MTJ device is switched by injection of spin polarized current. Further, a technique to inject spins through a barrier into a semiconductor gains increasing importance in the field of Metal-Oxide-Semiconductor type field effect transistor (spin MOSFET) and spin transistors in which spin-dependent output power is obtained. In these fields, a barrier of low resistance is required so as to achieve large on-state current.

Under the above-explained circumstance, the conventional $AlO_x$ amorphous barrier is not appropriate for the spin electronics device because of a too large contact resistance, heterogeneous properties due to large interface roughness between the ferromagnetic layer and the barrier layer, and generally small TMR value of about several tens % at room temperature.

On the other hand, in an epitaxial tunnel junction utilizing the crystalline MgO barrier, the properties of its electronic structure results in appearance of coherent tunnel effect, where tunnel transmission of $\Delta_1$ electrons increases in ferromagnetic materials having bcc structure such as, for example, Fe and FeCo. Therefore, tunnel resistance decreases, and TMR value is largely enhanced from the value expected from formula 1 (for example, W. H. Butler et al., Phys. Rev. B 63, 054416 (2001)). Specifically, under theoretical calculation, excessively large value of 5300% is expected for MTJ having a structure of Fe/MgO (8 atomic layers)/Fe grown in (001) direction, and 34000% is expected for CoFe/MgO (8 atomic layers)/CoFe structure (X.-G. Zhang and W. H. Butler, Phys. Rev. B 70, 172407 (2004)).

Co-based full-Heusler alloy is an intermetallic compound having a composition of $Co_2YZ$ type, and is generally expected to be a half-metal, that is, expected to show P=1, in $L2_1$ structure or in B2 structure. The B2 or $L2_1$ structure can be obtained relatively easily by epitaxially growing an MgO barrier on a Co-based Heusler alloy film, and growing a Co-based Heusler alloy film on the MgO barrier. The Inventors have proposed a half-metal Heusler alloy $Co_2FeAl_xSi_{1-x}$ (0<x<1) with controlled Fermi level (WO2007/126071), and reported large TMR value at room temperature (R. Shan et al., Phys. Rev. Lett. 102, 246601 (2009)).

It has been theoretically pointed out that the coherent tunnel effect through the MgO layer is effective for Co-based full-Heusler alloy (Y. Miura et al., J. Phys.: Condens. Matter 19, 365228 (2007)). However, where the Co-based full Heusler alloy is used as a material of ferroelectric layer, tunnel junction of high quality cannot be obtained due to large lattice mismatches with MgO (for example, $Co_2FeSi$ and MgO shows mismatch of 6%), resulting in generation of defects such as dislocations in the MgO barrier (H. Sukegawa et al., Phys. Rev. B 79, 184418 (2009)). Specifically, Co-based full Heusler alloy grown on the MgO barrier tends to have a disordered structure, and a large TMR value expected from half-metal is not detected. In addition momentum in the direction perpendicular to the layer plane is not conserved due to generation of disordered structure in the interface. As a result, the theoretically simulated enhancement of TMR due to the coherent tunnel effect is not always observed.

In addition, it is required to apply bias voltage of several hundred mV to 1V in order to writing and reading of information using the MTJ device. However, in the MTJ device having the amorphous AlOx barrier or the MgO barrier, there has been a general problem of reduction of TMR value to half of the zero-bias value upon application of bias voltage of about 500 mV. The large bias-voltage dependence of the TMR value is mainly caused by lattice defects and interface roughness between the ferromagnetic layer and the barrier layer. In the conventional amorphous AlOx barrier or MgO having large lattice misfit, it is very difficult to improve the above-described bias voltage dependence.

The inventors have proposed to use $MgAl_2O_4$ having spinel structure as a barrier layer of MTJ so as to reduce lattice mismatch and to realize MTJ of improved quality, and practically realized a MTJ having $MgAl_2O_4$ barrier epitaxially grown with (001) plane orientation (R. Shan et al., Phys. Rev. Lett. 102, 246601 (2009); H. Sukegawa et al., Appl. Phys. Lett. 96, 212505 (2010)). $MgAl_2O_4$ has a spinel structure (space group in International notation: Fd-3m) having a lattice constant of about 0.809 nm. Since half of the unit cell is smaller by ca. 4% compared with MgO (0.4213 nm), $MgAl_2O_4$ has excellent lattice matching with Fe and CoFe alloy each having bcc structure, and with the above-described Co-based Heusler alloy.

For example, lattice misfit can be controlled to small level, for example, 0.2% for $MgAl_2O_4$ and Fe, and 0.7% for $MgAl_2O_4$ and $Co_2FeAl_{0.5}Si_{0.5}$. In the above-described $Fe/MgAl_2O_4/Fe$ structure, in-plane lattice mismatch is about 1%, which is obviously smaller than lattice mismatch of about 3.5% between Fe and MgO (H. Sukegawa et al., Appl. Phys. Lett. 96, 212505 (2010)). The $MgAl_2O_4$ is a chemically stable material, which is, for example, known as a gem mineral, and does not have a deliquescence like MgO. Therefore, $MgAl_2O_4$ is promising as a material of high quality tunnel barrier. TMR value of the $Fe/MgAl_2O_4/Fe$ structure is 117% at room temperature and is 165% at 15K. These TMR values are apparently larger than the values (TMR=38 to 51%) calculated from the formula 1 and spin polarization of Fe in the range of 0.40 to 0.45. In addition, there is an unknown advantage that bias-voltage dependence of TMR value is largely improved by reduction of lattice mismatch. However, the obtained TMR value was not sufficiently large in comparison with crystalline MgO, and improvement was required. In addition, large TMR value was only obtained by the composition of $MgAl_2O_4$, and lattice constant could not be changed continuously while maintaining the large TMR value.

Based on the above-described circumstances, an object of the present invention is to decrease the effective lattice constant of $MgAl_2O_4$ type insulator by disordering its crystal structure, and achieving a high TMR value that has not known in the prior art using the disordered structure as the tunnel barrier layer, and to realize continuous modulation of lattice constant while maintaining the high TMR value by controlling the element composition.

SUMMARY OF THE INVENTION

During the research of MTJ utilizing $MgAl_2O_4$ barrier by the inventors, it was found that a spinel Mg—Al—O layer of disordered structure was formed by crystallization of oxide film where the oxide was formed from Mg—Al alloy film, and that TMR value achieved by the disordered spinel Mg—Al—O layer was significantly higher than that of the $MgAl_2O_4$ barrier having a spinel structure. The above-described spinel having a disordered structure denotes a structure where oxygen atoms are arranged in cubic close-packed lattice that is substantially similar to spinel lattice, the structure as a whole belongs to a cubic structure, but arrangement of magnesium and aluminum atoms are disordered. While Mg and Al are arranged in order in the tetrahedral vacancies and octahedral vacancies in the original spinel, Mg and Al are arranged in random arrangement in the above-described structure. As a result, the crystal symmetry of the structure is different from $MgAl_2O_4$, and the lattice constant of the structure is substantially half of 0.808 nm of $MgAl_2O_4$. Due to the change of the unit lattice, combination of electronic structure (band structure) with the ferroelectric material is changed, resulting in large enhancement of TMR value by coherent tunnel effect. It is known that the space group Fd-3m of $MgAl_2O_4$ is changed to Fm-3m or F-43m in disordered spinel with half-sized lattice constant, and five structures belongs to these space groups (K. E. Sickafus, Journal of Nuclear Materials 312, 111 (2003)). The disordered spinel may have any of the five structures.

As a result of experimental investigation and theoretical calculation, the inventors found that the disordered spinel provided large TMR value compared to $MgAl_2O_4$ with original ordered arrangement, and that a cubic structure, which was not known as the most stable structure, could be prepared by continuously changing Al—Mg composition from $Al_2O_3$ ($Al_{2.66}\square_{0.33}O_4$, where $\square$ denotes vacancy) to MgO. Based on the above-described findings, the inventors reached the present invention. By this constitution, it is possible to reduce the lattice mismatch with Co-based full-Heusler alloy, CoFe alloy or the like to minimum level, and a MTJ device having high TMR value and excellent bias voltage dependence of TMR value can be realized.

A ferromagnetic tunnel junction structure according to the present invention includes a first ferromagnetic layer, a second ferromagnetic layer, and a tunnel barrier layer that is interposed between the first ferromagnetic layer and the second ferromagnetic layer, wherein the tunnel barrier layer includes a crystalline non-magnetic material (nonmagnetic oxide) having constituent elements that are similar to those of an crystalline oxide that has a spinel structure as a stable phase structure; the non-magnetic material has a cubic structure having a symmetry of space group Fm-3m or F-43m in which atomic arrangement in the spinel structure is disordered; and an effective lattice constant of the cubic structure is substantially half of a lattice constant of the oxide of the spinel structure.

In the above-described ferromagnetic junction structure, the crystalline oxide having the spinel structure may be a spinel shown by general formula $AB_2O_4$ or $A_2B'O_4$ or a solid solution thereof, where A denotes one or more element that form divalent ion, B denotes one or more element that form trivalent ion, and B' denotes one or more element that form tetravalent ion. Spinels shown by different formula, for example, $\gamma$-$Al_2O_3$ may be included in the crystalline oxide having the spinel structure.

In the structure of disordered spinel, the occupancy of tetrahedral interstitial sites and octahedral interstitial sites of oxygen array by cations is disordered from the standard cation occupancy in spinel structure.

In the above-described described ferromagnetic tunnel junction structure, each of the first ferromagnetic layer and the second ferromagnetic layer may have a direct contact with the tunnel barrier layer. In other words, upper face of the first ferromagnetic layer may be in contact with the lower face of the tunnel barrier layer, and the lower face of the second ferromagnetic layer may be in contact with the upper face of the tunnel barrier layer.

In the above-described ferromagnetic tunnel junction structure, each of the first ferromagnetic layer and the second ferromagnetic layer may be made of pure metal or an alloy.

The above-described described ferromagnetic tunnel junction structure may constitute a ferromagnetic coherent tunnel junction structure that shows tunnel magneto-resistance of 80% or more and 34000% or less in room temperature due to coherent tunnel effect.

In the above-described tunnel junction structure, the tunnel magneto-resistance may be larger than the value of tunnel magneto-resistance TMR shown by the below described formula 1.

$$TMR = 2P_1 P_2 / (1 - P_1 P_2) \quad \text{formula 1,}$$

where $P_1$ denotes spin polarization of the first magnetic layer and $P_2$ denotes spin polarization of the second magnetic layer.

In the above-described ferromagnetic tunnel junction structure, elemental constitution of the non-magnetic material of the tunnel barrier layer may be shown by $(Mg_{1-x}Al_x)$—O where $0 < x \le 1$ is satisfied. That is, the non-magnetic oxide may include Mg, Al, and O, where relative amount of Mg and Al may be shown by $Mg_{1-x}Al_x$, where x is more than 0 and 1 or less.

The non-magnetic material may be a disordered spinel having elements that constitute spinel shown by the $AB_2O_4$, where A element is Mg and B element is one or two selected from Mg and Al.

In the above-described ferromagnetic tunnel junction structure, chemical composition of the non-magnetic material may be shown by $Mg_xAl_{(0.4-0.8x)}O_{(0.6-0.2x)-\delta}$, where $0 \le x < \frac{1}{2}$ and $-0.05 < \delta < 0.15$ are satisfied. Here, $\delta$ denotes a deviation from ideal (stoichiometric) anion/cation ratio.

The above-described tunnel junction structure may be a ferromagnetic coherent tunnel junction structure in which an increase of the TMR value due to the coherent tunnel effect appears.

A magneto-resistive element according to the present invention is a magneto-resistive element that utilizes the above-described ferromagnetic tunnel junction structure according to the present invention.

A spin electronics device according to the present invention is a spin electronics device that utilizes the above-described ferromagnetic tunnel junction structure according to the present invention.

According to the present invention, the use of disordered spinel structure in which arrangement of atoms (for example, Mg atoms and Al atoms) are disordered provides TMR value that is larger than the case of using ordered spinel barrier (for example, $MgAl_2O_4$ spinel barrier). In addition, tunnel barrier and tunnel junction with qualities higher than the case of using MgO barrier can be obtained by sputtering method. Further, the disordered structure allows preparation of the tunnel barrier layer within wide range of composition. For example, the lattice constant can be modulated in the composition defined by $Mg_xAl_{(0.4-0.8x)}O_{(0.6-0.2x)}$, where $0 \le x < \frac{1}{2}$ is satisfied. As a result, it is possible to reduce the lattice mismatch in the interface with the adjacent ferromagnetic layer to a minimum level. By this constitution, it is possible to maintain a high TMR value even when a high bias voltage is applied.

Different from the perfectly ionic crystal of MgO, the disordered spinel is free of deliquescency and is chemically stable due to the covalent bond (for example, generated by the presence of Al). Therefore, it is possible to suppress deterioration of the element during device processing process. Therefore, the tunnel junction structure of the present invention can be applied to magnetic head of hard disk drive (HDD), MRAM, and to various spin electronics device such as a spin resonance tunnel device constituted of ferromagnetic dual tunnel junction, and spin logic device such as spin MOSFET requiring effective spin injection to the semiconductor, each requiring application of bias voltage. Specifically, when a magnetic layer is stacked on Si substrate or Ge substrate via a tunnel barrier layer in the application to spin MOSFET, the use of non-magnetic material according to the invention having the disordered spinel structure such as disordered Mg—Al—O as the barrier layer, it is possible to grow a magnetic layer with small lattice strain. As a result, it is possible to inject spins from the magnetic layer to the Si or Ge effectively. In addition, similar effect can be expected in the disordered spinel based material having constituent elements other than Mg and Al. Thus, the disordered spinel may be combined with various ferromagnetic, nonmagnetic materials.

BRIEF DESCRIPTION OF THE DRAWINGS

FIG. 2A to 2C show structures with space group of Fm-3m, and FIGS. 2D and 2E show structures with space group of F-43m.

FIGS. 4A to 4D show results of analysis of cross sections of tunnel junction structures that have tunnel barrier of the present invention.

DETAILED DESCRIPTION OF THE INVENTION

A ferromagnetic tunnel junction structure of the present invention includes a tunnel barrier layer, wherein the tunnel barrier layer is composed of cubic crystal of nonmagnetic material (nonmagnetic oxide material). The tunnel barrier layer is composed of elements that constitute a material having a spinel structure as a stable phase. In the structure of the tunnel barrier layer, cation occupancy in the tetrahedral interstitial sites and octahedral interstitial sites of oxygen is disordered, and the structure has a symmetry of Fm-3m or F-43m space group, where effective lattice constant is substantially half of a lattice constant of the original (standard) spinel structure.

Figure 1:
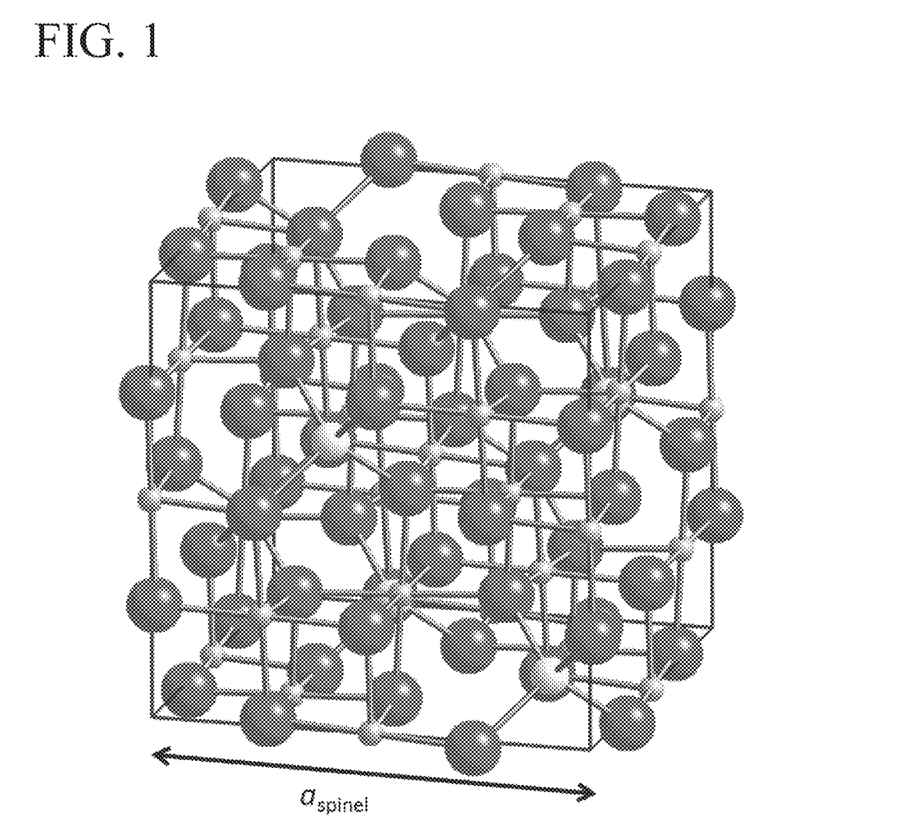
FIG. 1 is a schematic diagram of ordered spinel structure, where large black balls denote oxygen atoms, gray balls of intermediate size denote cations (for example, Mg) in tetrahedral interstitial sites, and small gray balls denote cations (for example. Al) in octahedral interstitial sites.
Figure 2:
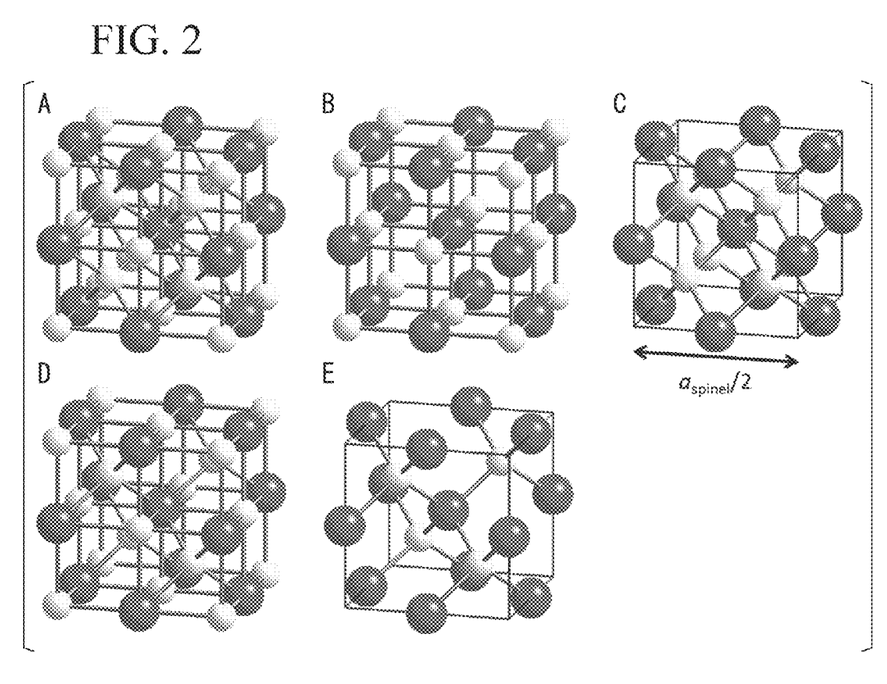
FIGS. 2A to 2E are schematic drawings that show disordered spinel structures that are expected from the tunnel barrier of the present invention and have a lattice constant of ($a_{spinel}/2$), where $a_{spinel}$ is a lattice constant of ordered spinel. Black balls show oxygen atoms (oxygen ions) and gray balls show cations.

FIG. 1 is a schematic diagram that shows a spinel structure (space group Fd-3m) that can be shown by $AB_2O_4$ (for example, $MgAl_2O_4$). In FIG. 1, black balls show oxygen atoms of cubic close packing, gray balls of intermediate size show A atoms (cations) that occupy tetrahedral interstitial sites of the oxygen array, and small gray balls show B atoms (cations) that occupy octahedral interstitial sites of the oxygen array.

The inventors found that a Mg—Al—O disordered spinel structure was obtained by forming (sputtering) a $Mg_{1-x}Al_x$ ($0<x\leq1$) film of about 0.4 to 2.0 nm in thickness on the lower magnetic layer by using a magnetron sputtering apparatus, subjecting the film to plasma oxidation or spontaneous oxidation by introducing oxygen, and subsequently subjecting the film to a heat treatment at an appropriate temperature.

Here, the disordered structure (disordered spinel structure) denotes a structure where lattice constant is half of the ordered spinel structure (FIG. 1) while the arrangement of oxygen atoms is not substantially different from that of the ordered spinel, but tetrahedral sites and octahedral sites that are not occupied in the ordered spinel are occupied by cations.

The allowable structures includes five structures as shown in FIGS. 2A to 2E.

In accordance with Wycoff notation of equipoints, A cations and B cations are arranged on 8a and 16d equipoints in space group Fd-3m of the $AB_2O_4$ spinel structure shown in FIG. 1. On the other hand, the structure shown in FIGS. 2A to 2C belong to space group Fm3m, and the structure shown in FIGS. 2D and 2E belongs to F-43m, where cations are randomly arranged on 4a and 8c equipoints (FIG. 2A), 4a equipoints (FIG. 2B), 8c equipoints (FIG. 2C), 4a and 4c equipoints (FIG. 2D), or 4c equipoints (FIG. 2E) (O anions for FIGS. 2A to 2E are arranged on 4b equipoints). It is acceptable that the structure is selected from any one of the five structures or a mixed structure in which two or more selected from the five structures are mixed in a crystal.

It is possible to improve quality of crystal by inserting pure Mg layer of 0.1 to 1.0 nm in thickness before stacking the $Mg_{1-x}Al_x$ layer.

It was also found that MTJ having epitaxially grown Mg—Al—O disordered spinel layer and upper magnetic layer on the lower magnetic layer could be prepared by selecting the ferromagnetic material to have a bcc structure having good lattice matching with the barrier layer. The Mg—Al—O disordered spinel barrier layer has a cubic structure or a tetragonal structure in which the crystal is slightly elongated by the adjacent magnetic layer along the layer plane or in the direction perpendicular to the layer plane.

In the present invention based on these findings, it can be considered that the barrier layer is composed of cubic or tetragonal crystal having disordered spinel structure and has a lattice constant that is half of the lattice constant of a standard spinel, where the standard spinel denotes a ordered spinel that is composed of similar elements as the disordered spinel. As a material (reference material, standard material) before disordering, it is possible to apply non-magnetic oxide having spinel structure as a stable structure. For example, the material may be selected from $MgAl_2O_4$, $ZnAl_2O_4$, $MgCr_2O_4$, $MgMn_2O_4$, $CuCr_2O_4$, $NiCr_2O_4$, $GeMg_2O_4$, $SnMg_2O_4$, $TiMg_2O_4$, $SiMg_2O_4$, $CuAl_2O_4$, $Li_{0.5}Al_{2.5}O_4$, $\gamma$-$Al_2O_3$ (cubic alumina) or the like. Except for oxygen, constituent elements are not limited to one or two element, and the material may be constituted of a plurality of elements like as, for example, $(Mg, Zn)(Al,Ga)_2O_4$.

For example, where the spinel is shown by $AB_2O_4$, A may be one or more element selected from Mg, Zn, Cu, Cd, Li, Ni, Fe, Co, Mn, Cr, Hg and V, and B may be one or more element selected from Al, Ga, In, Sc, Ti, V, Cr, Mn, Fe, Rh, Ir and Co. Where the spinel is shown by $A_2B'O_4$, A may be one or more element selected from Mg, Zn, Cu, Cd, Li, Ni, Fe, Co, Mn, Cr, Hg, Ag and V, and B' may be one or more element selected from Ti, Mn, Si, Ge, Mo and Sn.

Figure 3:
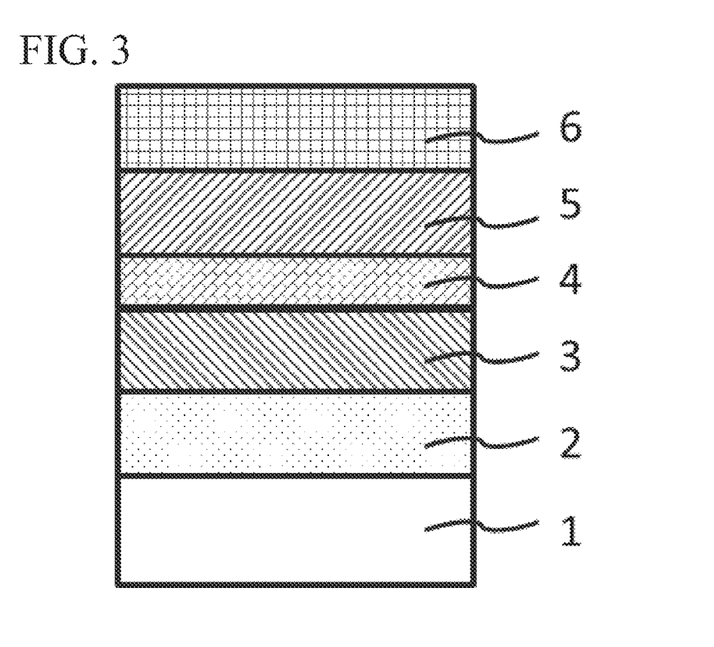
FIG. 3 is a cross-sectional drawing for explaining a tunnel junction structure that has a tunnel barrier of the present invention.

The thickness of the tunnel barrier layer may be controlled to be in the range of 0.4 nm to 20 nm, and preferably to be from 0.6 nm to 5.0 nm It is possible to obtain an effect by using these disordered spinel material in a structure including MTJ composed of, as shown in FIG. 3, substrate 1/conductive layer 2/lower ferromagnetic layer (first ferromagnetic layer) 3/disordered spinel barrier layer 4/upper ferromagnetic layer (second ferromagnetic layer) 5/conductive layer 6.

As the lower ferromagnetic layer, and the upper ferromagnetic layer, it is possible to apply a material having good lattice matching with the barrier layer.

Preferably, lattice misfit between the ferromagnetic layer and the barrier layer is 10% or less, more preferably 5% or less, more preferably 3% or less.

Where the barrier layer is constituted of Mg—Al—O, Co-based full Heusler alloy, bcc CoFe alloy, $Li_0$ type FePt alloy may be applied as the material of the magnetic layer. Fe may also be used. A thickness of the each ferromagnetic layer may be controlled to be in the range of 0.4 nm to 100 nm, and preferably to be from 0.7 nm to 5.0 nm.

Any substrate that allows epitaxial tunnel junction in (001) orientation may be applied as the substrate. For example, MgO, spinel $MgAl_2O_4$, Si, Ge or GaAs may be used as the substrate.

Where necessary, a buffer layer composed of $MgAl_2O_4$, CoFe alloy, Cr, Ag, or MgO is formed on the substrate. Where necessary, a conductive layer may be formed on the substrate.

A silicon substrate with a thermal oxidation film may be applied as the substrate. In this case, by sputtering MgO target or Mg—Al—O target under controlled conditions of Ar gas pressure and/or sputtering power, oxide film with (001) orientation may be formed on the oxidation film, and MTJ with (001) orientation may be formed on the oxide film.

The lower magnetic layer, barrier layer, and the upper magnetic layer are formed sequentially on the lower layer, for example, in accordance with the below described process.

Firstly, Fe film is formed as the lower magnetic layer. After that, by performing in-situ heat treatment at a temperature of about 200° C., it is possible to obtain a flat Fe film with satisfactory crystallinity.

Where a Mg—Al—O disordered spinel oxide film is selected as the barrier layer, thin Mg layer and Mg—Al layer are stacked continuously on the lower magnetic layer (Fe film). After that, oxygen is introduced to perform plasma oxidation of the film.

Then, by performing heat treatment at 300 to 400° C. in the vacuum, Mg—Al—O oxide film of disordered spinel structure is formed as the barrier layer. Alternatively, oxygen may be introduced during the Mg—Al film formation to form an oxide film by reactive sputtering, and the oxide film may be subjected to the heat treatment. The amount of oxygen is not limited to stoichiometric amount, but the disordered spinel film may include oxygen deficiency or excess oxygen. It is acceptable if the finally produced oxide has a composition of $Mg_xAl_{(0.4-0.8x)}O_{(0.6-0.2x)-\delta}$, where $0 \leq x < \frac{1}{2}$, and $-0.05 < \delta < 0.15$ are satisfied.

Next, by sputtering Fe layer on the tunnel barrier layer, it is possible to achieve Fe film with (001) orientation as the upper magnetic layer.

Thus, a epitaxial MTJ with (001) orientation as a whole could be produced. Where necessary, a conductive layer may be formed on the upper magnetic layer.

More large TMR value may be obtained where CoFe alloy or Co-based half metal Heusler alloy is used in place of Fe.

The film formation may be performed by general film formation method such as sputtering method, evaporation method, laser abrasion method, and MBE method.

The Example of the present invention is explained.

Example 1

Under room temperature, a Cr layer of 40 nm in thickness and Fe layer of 30 nm in thickness were sequentially stacked on a MgO (001) substrate using a magnetron sputtering device, where the Cr layer was formed as a buffer layer. After that, the substrate was subjected to heat treatment at 200° C. for 15 minutes to improve crystallinity of the Fe film. Next, Mg film of 0.45 nm was formed at room temperature. The obtained stacked film (stacked structure) of MgO (001) substrate/Cr (40 nm)/Fe (30 nm)/Mg (0.45 nm) was introduced into a chamber for oxidation. $Mg_{33}Al_{67}$ layer of 1.5 nm was formed on the Mg layer by sputtering a target having $Mg_{33}Al_{67}$ alloy composition. Ar and oxygen were introduced into the chamber, and Mg—Al oxide film was formed by induced plasma coupling (ICP) treatment. In this treatment, the ratio of the partial pressures of Ar and oxygen was 3:17, the total gas pressure was 6 Pa, and the duration of oxidation was 15 seconds.

The stacked film was introduced to the film formation chamber, and heat treated at 400° C. for 15 minutes. By this treatment, Mg layer and Mg—Al layer are mixed to form a disordered spinel structure.

By insertion of the Mg layer beneath the $Mg_{33}Al_{67}$ layer, the Mg—Al—O layer was enriched in Mg than $MgAl_2O_4$.

Next, Fe layer of 7 nm in thickness was stacked, and the stacked structure was subjected to heat treatment of 15 minutes at 350° C.

Next, IrMn layer of 12 nm thickness, and Ru of 7 nm thickness were stacked under a room temperature. Thus, a spin valve type ferromagnetic tunnel junction structure was obtained. In the description of the stacked film, the number in the parenthesis denotes thickness. The Mg—Al oxide constitutes a tunnel barrier layer. IrMn is an anti ferromagnetic material that has a function of fixing spins of the upper Fe layer. Ru is a protective film and functions as a mask layer during micromachining.

Next, the whole of the stacked film was heat treated at a temperature of 175° C. while applying magnetic field of 5 kOe. Thus, a magnetic anisotropy in a single direction was provided to the upper magnetic Fe layer. After that, the above-described stacked film was micro-machined to about 10 µm×5 µm in size using photolithography and ion milling. Outer magnetic field was applied to this element, and temperature dependence of TMR value was measured.

Figure 4:
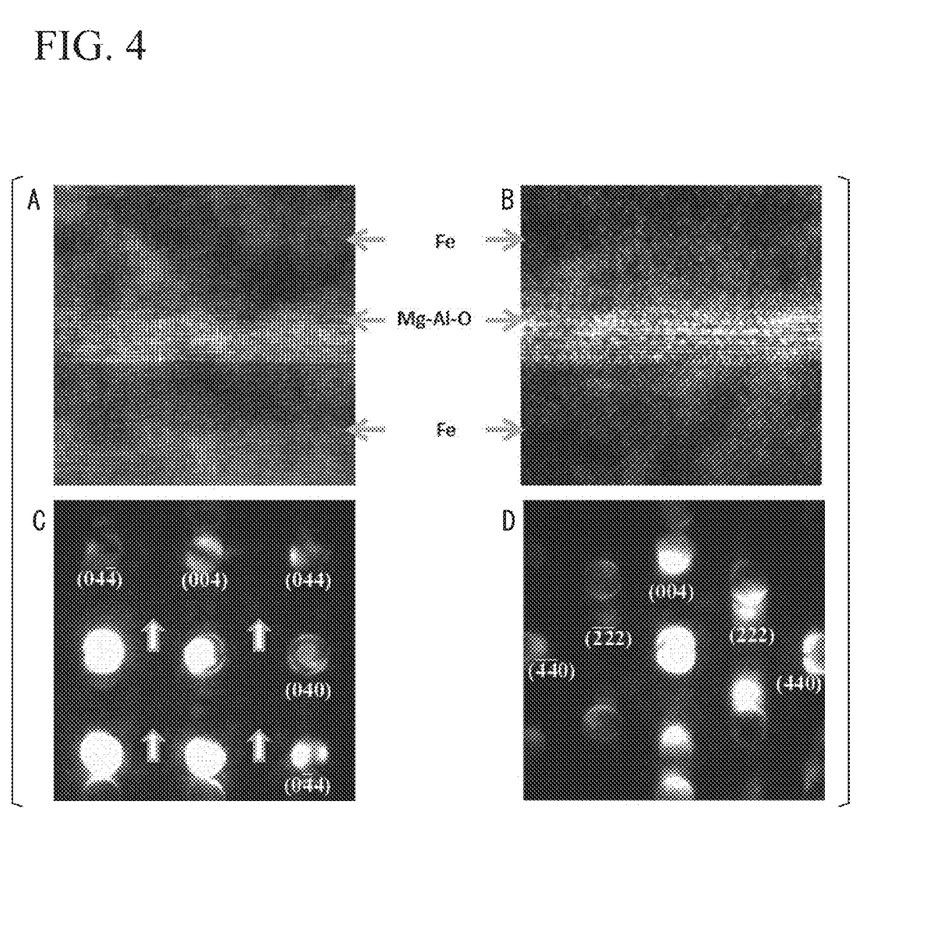
FIG. 4A is a TEM image of cross section with Fe in [110] direction.
FIG. 4B is a TEM image of cross section with Fe in [100] direction. The lower Fe layer, Mg—Al—O tunnel barrier layer, and the upper Fe layer are shown by the arrows.
FIG. 4C is a nano-beam diffraction image of the barrier layer of the section with Fe in [110] direction.
FIG. 4D is a nano-beam diffraction image of the barrier layer of the section with Fe in [100] direction. If an ordered spinel structure exists, {022} diffraction spots appears in the positions pointed by arrows in FIG. 4C.

FIG. 4A shows a result observation using a transmission electron microscope (TEM) of a cross sectional structure of the stacked film, where the cross section is sliced in [110] direction of Fe. FIG. 4B shows a result of TEM observation of cross sectional structure of the stacked film, where the cross section is sliced in [110] direction of Fe. From these observations, it is understood that the Mg—Al—O barrier is a crystalline layer that has grown with epitaxial relationship with the lower Fe layer and the upper Fe layer.

FIG. 4C and FIG. 4D are electron beam diffraction images obtained using nano-electron beam. As a result of examination of crystal structure using the electron diffraction, diffraction spots of {022} plane and {111} plane in an ordered spinel structure did not appear in the diffraction images. As a result, it was confirmed that the barrier layer had a cubic structure where spinel structure was disordered. This structure is considered to belong to any one or mixture of five structures shown in FIG. 2, and the lattice constant is considered to be half of the lattice constant of the spinel structure.

The obtained in-plane lattice constant of Mg—Al—O was 0.4078 nm, and the layer showed epitaxial growth with a relationship of Fe[100]//Mg—Al—O [110] in the plane. In this time, lattice mismatch in the plane between Fe and Mg—Al—O is very small as about 0.5%.

Figure 5:
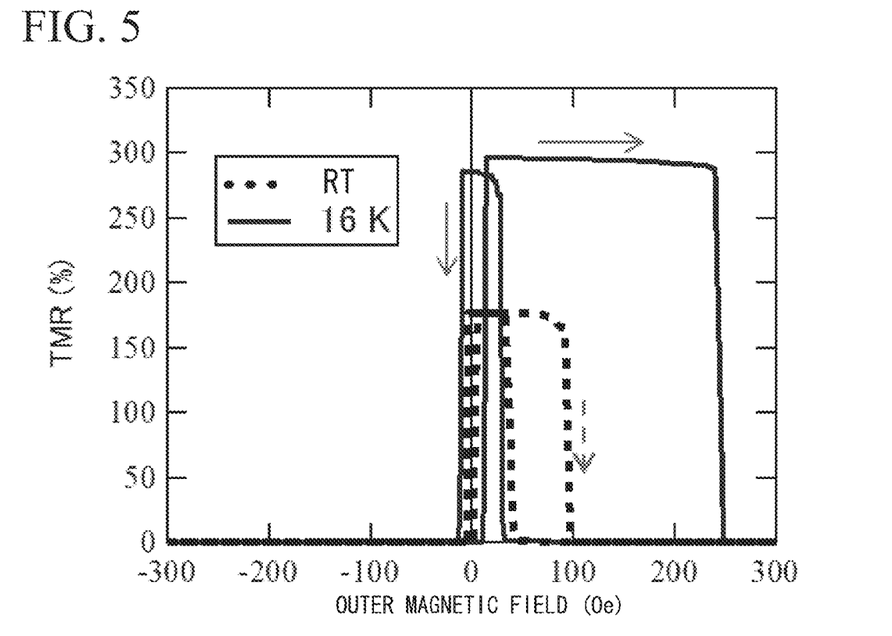
FIG. 5 is a tunnel magneto-resistance (TMR) curves at 16K and at room temperature (RT) of tunnel junction structure of Fe/Mg (0.45 nm)/$Mg_{40}Al_{60}$ (0.9 nm)-O/Fe that has a tunnel barrier of the present invention.

Next, results of measurement of magneto-resistance at 15K and room temperature (RT) are shown in FIG. 5. A large TMR value of 296% at 15K, and 178% at room temperature were obtained. As a result of calculation based on the formula 1, it was confirmed that TMR value of 296% corresponded to spin polarization of Fe of 0.77 that was largely enhanced from the original value of 0.40 to 0.45.

Due to the satisfactory lattice matching, bias voltage ($V_{half}$) in which TMR value was decreased to half value showed large value of 1000 mV in both of positive bias voltage and negative bias voltage.

Compared to typical $V_{half}$ of about 400 mV to 700 mV in a MTJ device having MgO barrier (S. Yuasa et al., Nature Mater. 3, 868 (2004)), the obtained bias voltage is as large as a bias voltage in the case of using ordered spinel $MgAl_2O_4$ barrier (Japanese Patent Application No. 2009-099483, the content of which is incorporated herein by reference).

Theoretical simulation of TMR value was performed so as to clarify the reason of obtaining such high TMR value. The calculation was performed by ballistic conduction calculation based on the first principle band calculation using a quantum calculation code of Quantum espresso.

Figure 6:
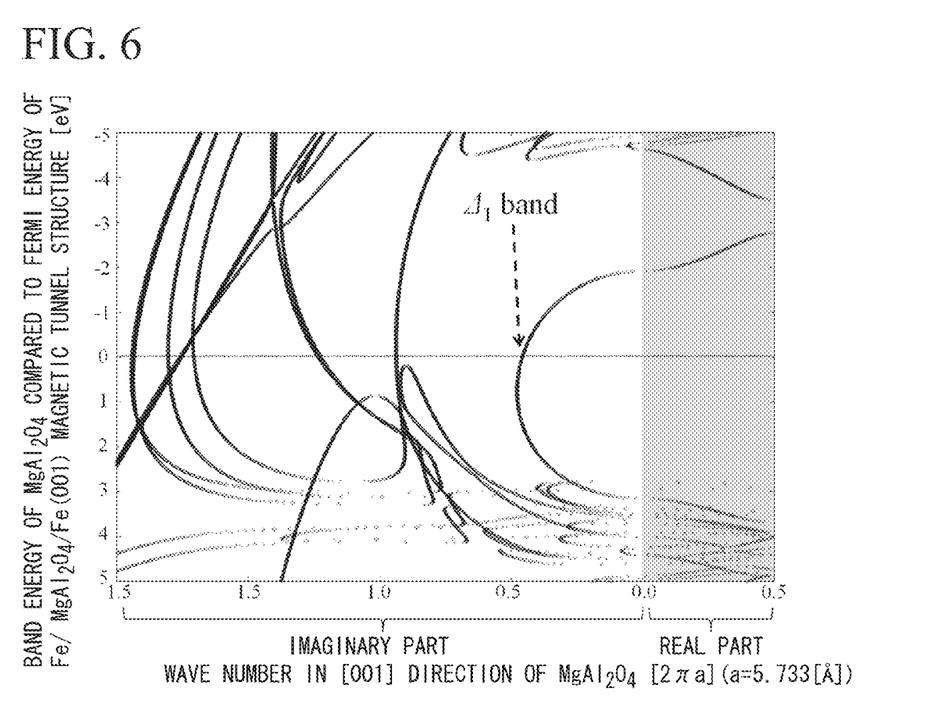
FIG. 6 is a band structure in [001] direction of $MgAl_2O_4$ having an ordered spinel structure.

FIG. 6 shows a band structure in the [001] direction of $MgAl_2O_4$ having an ordered spinel structure. Band energy is shown as a value compared to Fermi energy of Fe/$MgAl_2O_4$/Fe (001) magnetic tunnel junction structure used as a standard. The negative side of the lower axis shows imaginary component of band structure, and the band structure is directly related to the coherent tunnel effect. In $MgAl_2O_4$, in the vicinity of Fermi level $E=E_F=0$ of the imaginary part, there is a band corresponding to $\Delta_1$, and is most close to wave number=0. That means that where a tunnel junction structure in (001) plane orientation is formed of Fe, CoFe, Co-based Heusler alloy or the like, enhancement of TMR can be expected by the coherent tunnel effect, resulting in the similar effect as the effect of MgO known as coherent tunnel barrier. Therefore, it was confirmed that spinel type $MgAl_2O_4$ was also a coherent tunnel barrier.

However, the practically available TMR value obtained by Fe/ordered spinel $MgAl_2O_4$/Fe structure was small as up to 165% at 15K. To confirm the reason of the low TMR value, MTJ of Fe/ordered spinel $MgAl_2O_4$ (1 nm)/Fe structure was assumed, and conductance and TMR value were calculated for the case of parallel magnetization of the Fe layers and antiparallel magnetization of the Fe layers. The result is shown in Table 1.

Result of calculation for Fe/MgO (1 nm)/Fe structure showing practically large TMR value was shown as a comparative. The TMR value is shown as TMR=$(g_P-g_{AP})/g_{AP}$, where $g_P$ is a conductance (reverse of electric resistance) in the case of parallel magnetization, and $g_{AP}$ is a conductance in the case of anti-parallel magnetization.

It was confirmed that TMR value was only about 160% in Fe/$MgAl_2O_4$/Fe structure. This value is smaller by one order compared to the TMR value 1630% of Fe/MgO/Fe structure. The reason of the small TMR is explained by excessively large $g_{AP}$ in ordered $MgAl_2O_4$ barrier compared to MgO barrier. The reason is explained by lattice constant, in other word, unit of periodic lattice of a spinel structure is as large as 2 times the lattice constant of MgO having rock salt structure. Due to the large lattice constant, where the ordered $MgAl_2O_4$ layer is combined to ferromagnetic layer such as an Fe layer, the band structure of the ferromagnetic layer is not combined but collapsed due to difference in the lattice system. By the collapse of the band, additional conduction path appears and increases $g_{AP}$. As a result, enhancement of TMR by coherent tunnel effect is largely weakened. Therefore, a high enhancement of TMR like the MgO is expected if the effect of band collapse is avoided effectively.

TABLE 1

|  | Fe/$MgAl_2O_4$/Fe | Fe/MgO/Fe |
|---|---|---|
| Conductance $g_P$ in parallel magnetization | 0.5315 [1/$\Omega\mu m^2$] | 0.1160 [1/$\Omega\mu m^2$] |
| Conductance $g_{AP}$ in anti-parallel magnetization | 0.2044 [1/$\Omega\mu m^2$] | 0.006700 [1/$\Omega\mu m^2$] |
| TMR value | 160% | 1630% |

*TMR value [%] = 100 × $(g_P - g_{AP})/g_{AP}$

Based on the above-described arguments, a large TMR value due to coherent tunnel effect can be expected in the Mg—Al—O barrier, if the lattice constant of the spinel structure is effectively half-sized while avoiding large change in band structure of spinel, and the lattice is fitted to a lattice of the adjacent ferromagnetic material.

Oxygen sites in the practically obtained microstructure of Mg—Al—O barrier layer substantially maintain cubic close packing of, so called, fcc arrangement like as the ordered spinel. The term substantially was used since in the ordered spinel, the structure is slightly strained from perfect fcc structure due to presence of arrangement of Mg and Al atoms in order. Since band structure of the spinel $MgAl_2O_4$ is largely governed by the arrangement of oxygen atoms, it can be expected that the band structure is not changed largely even when the arrangement of Mg and Al atoms is disordered in tetrahedral and octahedral interstitial sites. Therefore, the experimentally availed high TMR value can be interpreted as a result of reduction of effective lattice constant to half value caused by disordering of positions of Mg and Al atoms while maintaining spinel band structure with minimum change. The enhancement of TMR by introduction of disorder was not known in the prior art. The effect can be expected not only in spinel based structure but also in various materials.

The additional reason for the high TMR value is that barrier has high crystallinity and epitaxial MRTJ of excellent lattice matching is obtained.

Example 2

Except for the target composition of $Mg_{17}Al_{83}$, using the same method as Example 1, MTJ device of Cr (40 nm)/Fe (30 nm)/Mg (0.45 nm)/$Mg_{17}Al_{83}$ (0.9 nm)-O/Fe (7 nm)/IrMn (12 nm)/Ru (7 nm) structure was prepared, where "Mg (0.45 nm)/$Mg_{17}Al_{83}$ (0.9 nm)-O" denotes an Mg—Al—O layer that was formed by oxidation of Mg layer of 0.45 nm and $Mg_{17}Al_{83}$ layer of 0.9 nm stacked on the Mg layer.

It was confirmed that the Mg—Al—O layer had a disordered spinel structure like as Example 1. Because of the large Al amount, the lattice constant of Mg—Al—O was further reduced, and the in-plane lattice mismatch of the barrier layer and the Fe layer in the obtained junction was as low as 0.1%.

Figure 7:
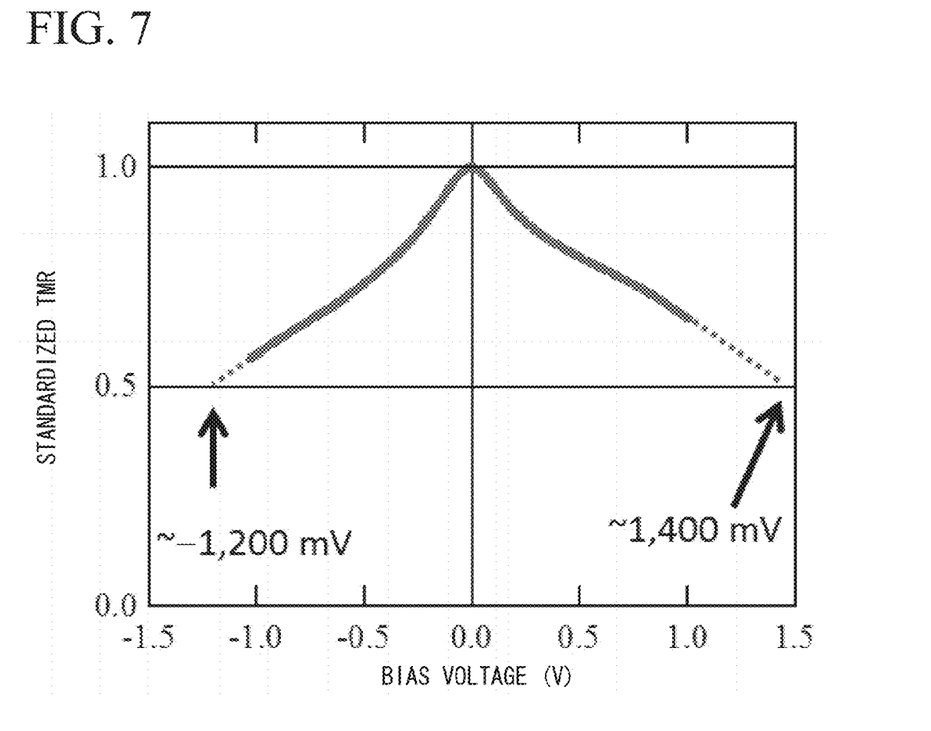
FIG. 7 is a graph showing bias voltage dependence of TMR value at room temperature of tunnel junction structure of Fe/Mg (0.45 nm)/$Mg_{17}Al_{83}$ (0.9 nm)-O/Fe that has a tunnel barrier of the present invention, where the TMR value is standardized by the TMR value of zero bias.

Large TMR value was obtained such that TMR value at 15K was 304%, and TMR value at room temperature was 185%. Along with realization of the high lattice matching, as shown in FIG. 7, $V_{half}$ showed large value of 1400 mV at positive bias voltage, and 1200 mV at negative bias voltage. Here, positive bias is defined as a bias in which electron flows from the upper layer to the lower layer.

Example 3

Except for forming a CoFe alloy layer between the upper and lower magnetic layers and the barrier layer, according to the same manner as Example 1 and Example 2, an MTJ having Cr (40 nm)/Fe (30 nm)/$Co_{50}Fe_{50}$ (2.5 nm)/Mg (0.45 nm)/$Mg_{33}Al_{67}$ (0.9 nm)-O/$Co_{50}Fe_{50}$ (2.0 nm)/Fe (5 nm)/IrMn (12 nm)/Ru (7 nm) was produced. CoFe alloy has a bcc structure and substantially same lattice constant with Fe. Therefore, CoFe layer inserted between the Fe layer and the barrier layer was also grown epitaxially. Since spin polarization of CoFe alloy is larger than that of pure Fe, TMR values at 15K and at room temperature were largely increased to 479% and 308% compared to the case of using Fe.

Example 4

Except for the thickness of $Mg_{33}Al_{67}$ layer and oxidation method of the barrier oxide layer, using the same manner as Example 3, MTJ of Cr (40 nm)/Fe (30 nm)/$Co_{50}Fe_{50}$ (2.5 nm)/Mg (0.2 nm)/$Mg_{33}Al_{67}$ (0.45 nm)-O/$Co_{50}Fe_{50}$ (2.0 nm)/Fe (7 nm)/IrMn (12 nm)/Ru (7 nm) was produced. In the preparation of the barrier layer, oxygen with a pressure of 5 Pa was introduced for duration of 620 seconds into the chamber after forming the Mg layer and the $Mg_{33}Al_{67}$ layer, thereby forming a natural oxide film. By the application of oxidation corresponding to reduction of thickness of the Mg layer and the $Mg_{33}Al_{67}$ layer, resistance (RA) per unit area could be reduced from conventional 1000 to 2000 $\Omega\mu m^2$ to about 5 $\Omega\mu m^2$ by three orders while maintaining the TMR value at 128% at room temperature.

Example 5

Except for using pure Al in place of Mg—Al alloy, and absence of Mg inserting layer, in the same manner as Example 1, a MTJ device of Cr (40 nm)/Fe (30 nm)/Al (1.16 nm)-O/Fe (7 nm)/Ru (0.8 nm)/Fe(1.5 nm)/IrMn (12 nm)/Ru (7 nm) structure was prepared.

Figure 8:
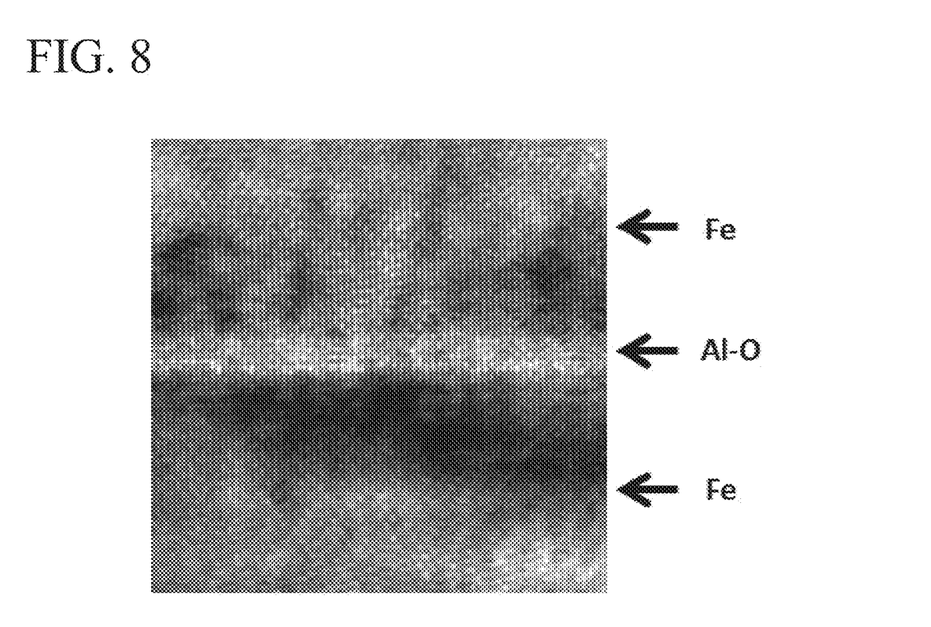
FIG. 8 is a TEM image of a cross section of a tunnel junction structure of Fe/Al (1.16 nm)-O/Fe with [110] direction of Fe. The lower Fe layer, Al—O tunnel barrier layer, and the upper Fe layer are shown by the arrows.

By optimizing the preparation condition of Al layer and oxidation condition of Al layer, as shown in FIG. 8, Al—O layer was grown epitaxially, and the structure had a cubic structure. The structure of the barrier layer is disordered from spinel-like structure of γ-$Al_2O_3$ (lattice constant: 0.791 nm), and the in-plane lattice constant had a value of 0.408 nm which was substantially similar to that of the disordered Mg—Al—O barrier.

TMR value at 15K and room temperature were measured to be 155% and 101%. In the prior art, report of Al—O layer in MTJ was limited to amorphous structure. In spite of extensive research on Al—O barrier, the highest record of TMR was 81% reported for CoFe/Al—O/CoFe structure (H. X. Wei et al., J. Appl. Phys. 101, 09B501 (2007)). The result shows that high value of TMR, which could not be achieved by the use of amorphous Al—O, could be achieved by using crystalline Al—O. That is, coherent tunnel effect functions in the case of Al—O having a disordered spinel structure.

As shown in the above-described examples, Mg—Al composition in the disordered spinel Mg—Al—O barrier layer can be changed continuously from Al—O to Mg—O by controlling the thickness of the Mg inserted layer and Mg—Al film composition.

As shown in Examples 1 to 4, disordered spinel Mg—Al—O structure may be prepared in any Mg—Al composition, and high TMR value can be realized using the coherent tunnel effect.

By the use of MTJ device that utilized crystalline tunnel barrier having disordered spinel structure, it is possible to utilize high TMR with high bias voltage under room temperature. In addition, the barrier layer is free of deliquescence that may cause problems in wet processing in the preparation of micro elements. As a result, a ferromagnetic layer/barrier layer interface of high quality can be achieved, and a highly reliable MTJ can be realized. Therefore, non-volatile random access magnetice memory (MRAM) can be developed using the MTJ as memory cells.

As shown in Example 4, reduction of resistance of MTJ can be achieved using the crystalline tunnel barrier layer of disordered spinel structure. Therefore, the MTJ can be applied as head censor of hard disk drive, and hard disk drive of large volume can be developed.

In addition, reduction of resistance realizes memory cells and logic circuits that correspond to spin injection magnetization reverse writing requiring large current in the order of $10^6$ $A/cm^2$. Therefore, the development of large volume MRAM and non-volatile logic LSI circuits can be expected.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A ferromagnetic tunnel junction structure comprising a first ferromagnetic layer, a second ferromagnetic layer, and a tunnel barrier layer that is interposed between the first ferromagnetic layer and the second ferromagnetic layer,
    wherein the tunnel barrier layer includes a crystalline non-magnetic material having constituent elements that are similar to those of a crystalline oxide that has a spinel structure as a stable phase structure;
    the non-magnetic material has a cubic structure having a symmetry of space group Fm-3m or F-43m in which atomic arrangement in the spinel structure is disordered; and
    an effective lattice constant of the cubic structure is substantially half of a lattice constant of the oxide of the spinel structure.

2. A tunnel junction structure according to claim 1, wherein each of the first ferromagnetic layer and the second ferromagnetic layer is composed of pure metal or an metallic alloy, and the first ferromagnetic layer and the second ferromagnetic layer are directly in contact with an upper face or a lower face of the tunnel barrier layer.

3. A ferromagnetic tunnel junction structure according to claim 1, wherein the tunnel junction structure constitute a ferromagnetic coherent tunnel junction structure that shows tunnel magneto-resistance of 80% or more and 34000% or less at room temperature due to a coherent tunnel effect.

4. A ferromagnetic tunnel junction structure according to claim 1, wherein elemental constitution of the non-magnetic material of the tunnel barrier layer is shown by $(Mg_{1-x}Al_x)$—O, where $0<x\le1$ is satisfied.

5. A magneto-resistive element that utilizes a ferromagnetic tunnel junction structure comprising a tunnel barrier layer and two ferromagnetic layers that sandwiches the tunnel barrier layer, wherein the ferromagnetic tunnel junction structure is a ferromagnetic tunnel junction structure according to claim 1.

6. A spin electronic device that utilizes a ferromagnetic tunnel junction structure comprising a tunnel barrier layer and two ferromagnetic layers that sandwiches the tunnel barrier layer, wherein the ferromagnetic tunnel junction structure is a ferromagnetic tunnel junction structure according to claim 1.

* * * * *